(12) United States Patent
Vo et al.

(10) Patent No.: US 7,480,202 B2
(45) Date of Patent: Jan. 20, 2009

(54) HIGH SPEED ARRAY PIPELINE ARCHITECTURE

(75) Inventors: Huy Vo, Boise, ID (US); Charles Ingalls, Meridian, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 12/072,125

(22) Filed: Feb. 22, 2008

(65) Prior Publication Data

US 2008/0225624 A1 Sep. 18, 2008

Related U.S. Application Data

(63) Continuation of application No. 11/186,525, filed on Jul. 21, 2005, now Pat. No. 7,352,649.

(51) Int. Cl.
*G11C 8/00* (2006.01)
(52) U.S. Cl. ............... 365/230.06; 365/207; 365/63; 365/185.23
(58) Field of Classification Search ............ 365/230.06, 365/207, 63, 185.23
See application file for complete search history.

(56) References Cited

U.S. PATENT DOCUMENTS

| | | | |
|---|---|---|---|
| 5,592,488 A | | 1/1997 | Thomann et al. |
| 5,666,324 A | * | 9/1997 | Kosugi et al. ............ 365/233.11 |
| 5,748,635 A | | 5/1998 | Thomann et al. |
| 5,901,110 A | | 5/1999 | Jang |
| 6,122,710 A | * | 9/2000 | Kumar et al. ............... 711/118 |
| 6,134,169 A | | 10/2000 | Tanaka |
| 6,141,286 A | | 10/2000 | Vo et al. |
| 6,166,942 A | | 12/2000 | Vo et al. |
| 6,275,443 B1 | | 8/2001 | Ingalls et al. |
| 6,282,135 B1 | | 8/2001 | Proebsting |
| 6,288,952 B1 | | 9/2001 | Zheng |
| 6,345,006 B1 | | 2/2002 | Ingalls et al. |
| 6,345,013 B1 | | 2/2002 | Ingalls et al. |
| 6,418,067 B1 | * | 7/2002 | Watanabe et al. ........... 365/200 |
| 6,735,113 B2 | | 5/2004 | Yoon |
| 6,809,986 B2 | | 10/2004 | Kim et al. |
| 6,836,427 B2 | | 12/2004 | Vo et al. |
| 6,901,023 B2 | | 5/2005 | Kirsch et al. |
| 7,280,427 B2 | | 10/2007 | Shin |
| 2003/0081449 A1 | * | 5/2003 | Beucler ...................... 365/154 |
| 2004/0136226 A1 | | 7/2004 | Foss |

\* cited by examiner

*Primary Examiner*—Tuan T. Nguyen
(74) *Attorney, Agent, or Firm*—Jones Day; Edward L. Pencoske

(57) ABSTRACT

A memory device comprising a memory array having a plurality of memory cells, and a plurality of peripheral devices for reading data out of and writing data into the memory array, the peripheral devices include a first write driver connected to a first input/output line, the first input/output line being associated with a digitline connected to certain of the plurality of memory cells, a first read amplifier connected to the first input/output line, a first input/output device responsive to a first column select signal for connecting the first input/output line to the digitline, a second write driver connected to a second input/output line, the second input/output line being associated with the digitline, a second read amplifier connected to the second input/output line, and a second input/output device responsive to a second column select signal for connecting the second input/output line to the digitline.

18 Claims, 10 Drawing Sheets

HIGH SPEED ARRAY PIPELINE ARCHITECTURE

The present application is a continuation of U.S. application Ser. No. 11/186,525 filed Jul. 21, 2005, now U.S. Pat. No. 7,352,649 and entitled High Speed Array Pipeline Architecture.

BACKGROUND

The present invention relates generally to a memory array architecture and more particularly to a high-speed array pipeline architecture used, for example, with a dynamic random access memory device (DRAM).

A typical DRAM memory device is comprised of a plurality of memory cells, each comprised of a transistor and a capacitor. The memory cells may be arranged in an array with each memory cell being connected to a wordline and a digitline. Each memory cell has a unique address. Each memory cell stores one bit of data in the form of a voltage. A high voltage level (e.g., Vcc) represents a logic "1", whereas a low voltage level (e.g., 0V) represents a logic "0". The DRAM may also include peripheral devices, such as logic circuits, drivers, decoders, sense amps, input/output devices, and power supplies, etc., that are used to identify memory cells, access the memory cells, store information within the memory cells, and read information from the memory cells, among others. Typically, the DRAM's control logic receives commands (e.g., read, write, etc.) and address information from a memory system controller. Row and column decoders decode the address information and the specific memory cell for which the command is directed is identified and the command executed.

FIG. 9 illustrates peripheral devices used by a DRAM according to the prior art. Two digitlines (e.g., D1, and D1*) and their associated peripheral devices are illustrated in FIG. 9. The digitlines (D1, D1*) are illustrated as being connected to two memory arrays (e.g., Array0 and Array1). The peripheral devices include equalization circuits (60a, 60b), isolation devices (such as transistors 61a, 61a*, 61b, and 61b*), input/output devices (such as transistors 63 and 63*), an n-sense amplifier 64, and a p-sense amplifier 62.

During a read operation, the digitlines D1 and D1* are initially equalized at a predetermined voltage (here Vcc/2) by setting ISOa*, ISOb*, EQa, and EQb high. One or more of these signals then transition low when an array is accessed. For example if Array0 is accessed, then EQa and ISOb* transition low (ISOb* is used to isolate Array1 digit capacitance from the sense amp to hasten the sensing operation).

Next, a selected wordline (not shown) is fired (i.e., activated) such that the memory cell (not shown) within Array0 identified by the address information from the memory controller is accessed (i.e., connected to its associated digitline). During the read operation, the memory cell shares its charge with its associated digitline. For example, assume that the identified cell is associated with digitline D1. When the memory cell's wordline is fired, the charge stored in the memory cell is shared with digitline D1. If the memory cell contains a stored logic one (e.g., Vcc), the charge sharing causes the voltage on digitline D1 to increase. If the memory cell contains a stored logic zero (e.g., GROUND), the charge sharing causes the voltage on digitline D1 to decrease. It should be noted that digitline D1* remains substantially at the precharge level Vcc/2 (the voltage of digitline D1* may change slightly due to parasitic coupling with, for example, D1 and the active wordline).

The differential voltage between the digitlines D1, D1* created when the memory cell is accessed is read or sensed by n-sense amplifier 64 and p-sense amplifier 62. Sensing generally refers to the amplification of the differential voltage between digitlines D1, D1* (i.e., the digitline signal). Because the differential voltage developed between digitlines D1 and D1* is used to read the memory cell contents, digitlines D1 and D1* are often referred to as a digitline pair. The sensed logic level is then output via input/output line I/O and its complement via is output via input/output line I/O* by activating the I/O transistors 63 and 63*, respectively, using a column select signal (CSEL).

During a write operation, the digitlines D1 and D1* are initially equalized at a predetermined voltage (here Vcc/2) by setting ISOa*, ISOb*, EQa, and EQb high. One or more of these signals then transition low when an array is accessed. For example if Array0 is accessed, then EQa and ISOb* transition low (ISOb* is used to isolate Array1 digit capacitance from the sense amp to hasten the sensing operation). A selected wordline (not shown) is fired such that the memory cell (not shown) within Array0 identified by the address information from the memory controller is accessed (i.e., connected to its associated digitline).

Next, a voltage logic level is then input via input/output lines I/O and I/O* by activating the I/O transistors 63 and 63* using CSEL. For example, a logic level 1 (i.e., Vcc) may be applied to digitline D1 via input/output line I/O and I/O transistor 63, whereas a logic level 0 (i.e., GROUND) may be applied to digitline D1* via input/output line I/O* and I/O transistor 63*. The new data states write over the existing data stored in the sense amplifiers (62, 64). After the sense amplifiers (62, 64) latch the new data, the I/O transistors (63, 63*) are shut down such that the sense amplifiers can restore the digitlines D1 and D1* (and thus, their associated, activated memory cells) to full levels. For example in the instant example, the memory cell associated with D1 is forced to logic 1, whereas the memory cell associated with D1* is forced to logic 0. The wordline is then deactivated when a precharge command is issued and the identified memory cell is disconnected from its associated wordline.

It should be apparent to one skilled in the art that above discussion has been simplified for clarity and that other operations or devices may be needed or used to effectively read data from, or write data to, a memory cell. For example, it should be apparent to one skilled in the art that the sense amplifiers (62, 64) may be bypassed and a logic level written directly to a selected memory cell.

FIG. 10 illustrates a simplified block diagram of a portion of a prior art memory system. The memory system includes a DRAM array 22 and peripheral circuits associated with digitline pair (D1-D1*). The peripheral circuits include equalization circuit 60, isolation transistors 61, p-sense amplifier 62, n-sense amplifier 64, input/output transistors 63, 63*, a column decode and driver circuit 71, a write driver 28, and a read sense-amplifier and driver 38. It should be apparent to one skilled in the art that the memory system illustrated in FIG. 10 is simplified and other components have been omitted as they are not required to form an understanding of the present invention.

As illustrated in FIG. 10, DRAM array 22 is accessed via digitlines D1 and D1* using a single column select line, a single input/output pair (I/O, I/O*), a single write driver 28, and a single read sense-amplifier and driver 38. This single column select architecture creates undesirable bottlenecks and increases the access time (i.e., the time it takes to read and/or write to a memory cell) required by the prior art memory system. These problems become more pronounced as processor speed and system clock frequency increase.

Thus, there exists a need for a high-speed array pipeline architecture that eliminates bottlenecks and which overcomes other limitations inherent in prior art.

SUMMARY

One aspect of this disclosure relates to a memory device comprising a memory array having a plurality of memory cells and a plurality of peripheral devices for reading data out of and writing data into the memory array. The peripheral devices include a first write driver connected to a first input/output line, the first input/output line being associated with a digitline connected to certain of said plurality of the memory cells. A first read sense-amplifier/driver is connected to the first input/output line. A first input/output device is responsive to a first column select signal for connecting the first input/output line to the digitline. A second write driver is connected to a second input/output line, the second input/output line being associated with the digitline. A second read sense-amplifier/driver is connected to the second input/output line. A second input/output device is responsive to a second column select signal for connecting the second input/output line to the digitline. Memory systems and computing systems incorporating such a memory array are also disclosed.

Another aspect of this disclosure relates to a memory device of the type comprising a memory array having a plurality of memory cells, said memory cells being accessed via a plurality of digitline pairs, the improvement comprising each of said plurality of digitline pairs being associated with first and second read drivers, said drivers connected to said digitline pair through first and second input/output devices responsive to separate control signals.

Another aspect of this disclosure relates to a method for reading and writing data within a memory cell connected to a digitline, the digitline being associated with a first input/output device and a second input/output device. The method comprises generating first and second control signals. The first input/output device is activated in response to the first control signal to store and/or retrieve data within the memory cell. Thereafter, the first input/output device is deactivated. After deactivating the first input/output device, the second input/output device is activated in response to the second control signal to store and/or retrieve data within the memory cell. Thereafter, the second input/output device may be deactivated. Generating the first and second control signals may comprise generating a master toggle control signal upon receiving a read or write command, firing the first control signal on the rising edge of the master toggle control signal upon receiving said read or write command, and firing the second control signal on the falling edge of the master toggle control signal upon receiving another read or write command.

Another aspect of this disclosure relates to a method for accessing a memory cell connected to a digitline. The method comprises activating a first input/output device connected to the digitline upon receiving a first read or write command, deactivating the first input/output device, activating a second input/output device connected to the digitline upon receiving a second read or write command, and deactivating the second input/output device while the first input/output device is activated.

BRIEF DESCRIPTION OF THE DRAWINGS

To enable the present invention to be easily understood and readily practiced, the present invention will now be described for purposes of illustration and not limitation, in connection with the following figures wherein.

DETAILED DESCRIPTION

Figure 1:
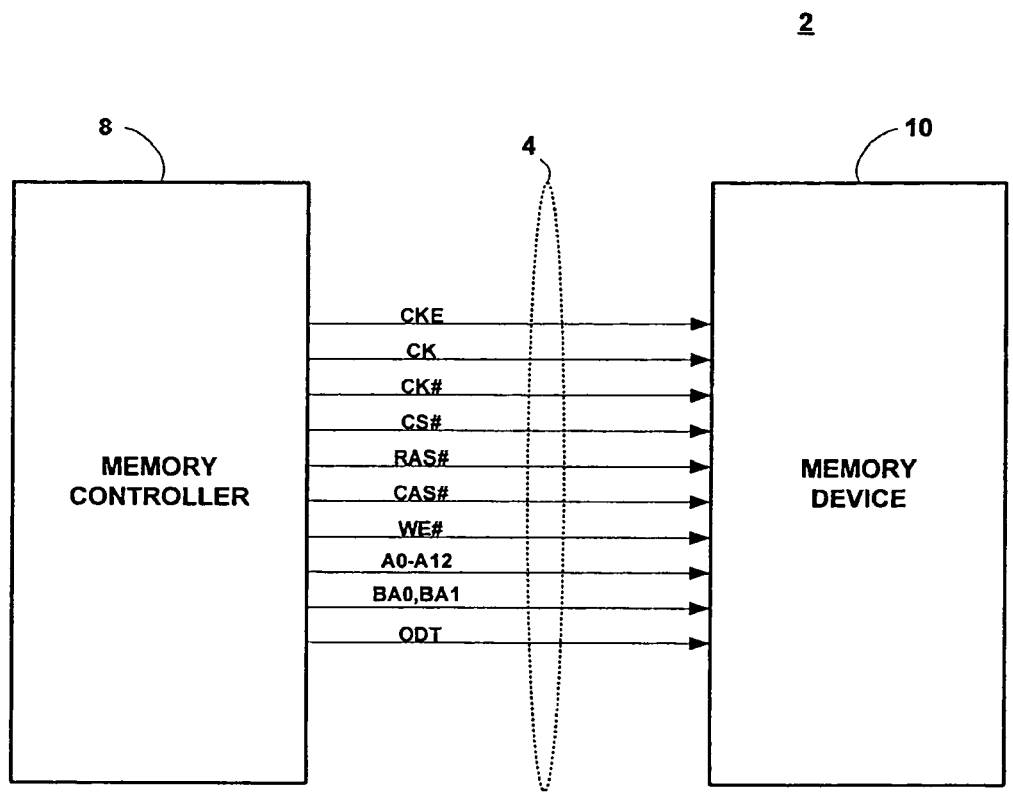
FIG. 1 is a simplified block diagram of a memory system 2 according to one embodiment.

FIG. 1 is a simplified block diagram of a memory system 2 according to one embodiment. The memory system 2 includes a memory controller 9 and a memory device 10, such as a DDR-III DRAM. The use of a DDR-III DRAM is for exemplary purposes only and is not intended, in any manner, to limit the scope of the present invention. It should be apparent to those skilled in the art that other types of memory devices may be used while remaining within the scope of the present invention. For example, a synchronous dynamic random access memory (SDRAM), a psuedo-static dynamic random access memory (PSDRAM), a double data rate dynamic random access memory (DDR DRAM), a DDRII DRAM, an extended data out dynamic random access memory (EDO DRAM), an embedded DRAM and graphic DRAM, among others, may be used.

Additionally, it should be apparent to those skilled in the art that the memory system 2 may include other components while remaining within the scope of the present invention. For example, memory system 2 may include a microprocessor, micro-controller, ASIC, etc. which is in communication with the memory controller 8 and the DDR-III DRAM 10.

The memory controller 8 and DDR-III DRAM 10 communicate via a system bus 4. In the current embodiment, the system bus 4 carries command signals, address signals, and data signals, among others. The system bus 4 may be subdivided into two or more buses, for example a command bus 12 (shown in FIG. 2), an address bus 16 (shown in FIG. 2), and a data bus 37 (shown in FIG. 2). The command bus 12 may carry the row address strobe (RAS#), column address strobe (CAS#), and write enable (WE#) command signals, among others. The address bus 16 may carry bank address (BA0, BA1) and address input (A0-A12) signals, among others. The data bus 37 may carry data input/output signals (DQ0-DQ15), data strobe signals (LDQS, LDQS#, UDQS, UDQS#), and data mask signals (LDM, UDM), among others. Additionally, some command signals, such as chip select (CS#), clock enable (CKE), and on-die termination (ODT) signals may be carried by the command bus 12 or by another portion of the system bus 4. It should be apparent to one skilled in the art that the topology of the system bus 4 (and its component parts) may be varied while remaining within the scope of the present invention. It should further be apparent to one skilled in the art that the illustrated signals are for exemplary purposes only and not intended to limit the present invention in any manner.

Figure 2:
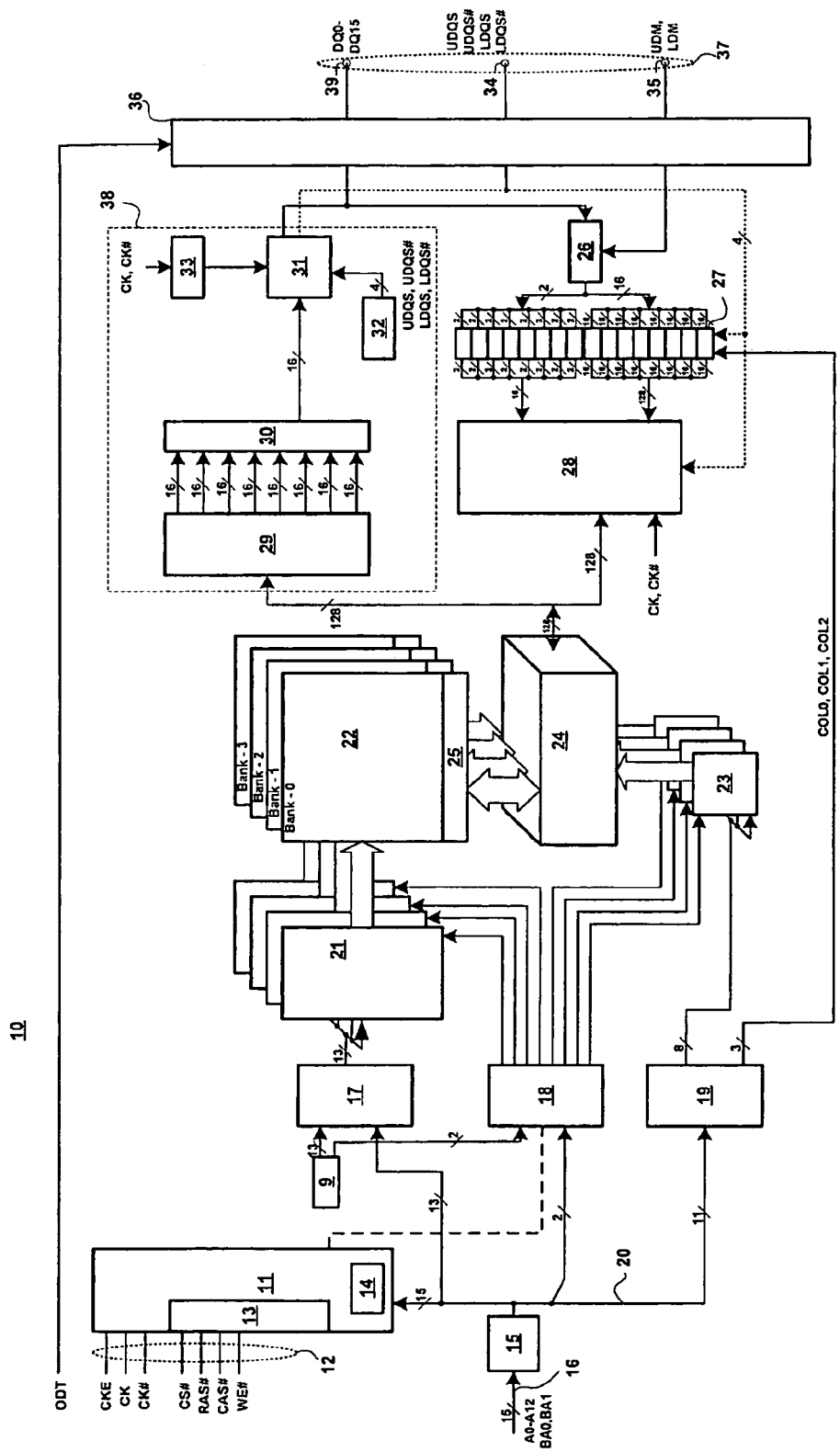
FIG. 2 illustrates a simplified functional block diagram of an architecture for the DDR-III DRAM of FIG. 1 according to one embodiment.

FIG. 2 illustrates a simplified functional block diagram of an architecture for the DDR-III DRAM 10 of FIG. 1 according to one embodiment. The DDR-III DRAM 10 includes control logic 11 responsive to a plurality of command signals (e.g., CS#, RAS#, CAS#, WE#, CKE, CK, CK#, ADR, BA, etc.) from command bus 12. The control logic 11 includes a command decode circuit 13 and mode register circuits 14, among others. Table 1 illustrates a truth table for the command coding of the DDR-III DRAM 10 according to the current embodiment.

TABLE 1

DDR-III DRAM Coding Truth Table (L = 0, active; H = 1, inactive).

| FUNCTION | CKE Previous Cycle | CKE Current Cycle | CS # | RAS # | CAS # | WE # |
|---|---|---|---|---|---|---|
| Write | H | H | L | H | L | L |
| Read | H | H | L | H | L | H |
| Bank Activate | H | H | L | L | H | H |
| Load Mode | H | H | L | L | L | L |
| Refresh | H | H | L | L | L | H |
| Self-Refresh Entry | H | L | L | L | L | H |
| Self-Refresh Exit | L | H | H | X | X | X |
|  |  |  | L | H | H | H |
| Precharge | H | H | L | L | H | L |
| No Operation | H | X | L | H | H | H |

Referring to Table 1 for example, when the memory controller 8 sets CS#=L, RAS#=H, CAS#=L and WE#=L, the command decode circuit 13 decodes the signals as a write command function. It should be apparent to those skilled in the art that different and/or additional signals (e.g., BA, ADR, etc.) may be used to encode each command function. It should further be apparent to one skilled in the art that the specific state of each command signal (i.e., CS#, RAS#, etc.) used to define each command function (i.e., write, read, etc.) may be altered while remaining within the scope of the present invention.

The DDR-III DRAM 10 also includes an address register 15 responsive to an address bus 16 which carries a plurality of address signals (e.g., A0-A12, BA0, BA1, etc.). The control logic 11 and the address register 15 communicate with each other, and with a row address multiplexer circuit 17, a bank control logic circuit 18, and a column address counter/latch circuit 19, via an internal bus 20.

The bank control logic 18 is responsive to the control logic 11, the address register 15, and a refresh counter 9. The row address multiplexer 17 is also responsive to the control logic 11, the address register 15, and the refresh counter 9. A series of row latch/decoders 21 are responsive to the bank control logic 18 and the row address multiplexer 17. One row latch/decoder 21 is provided for each memory array 22. Each memory array 22 is comprised of a plurality of memory cells each operable to store one bit of information. Four memory arrays 22, labeled bank 0 through bank 3, are illustrated in FIG. 2. Accordingly, there are four row latch/decoder circuits 21, one each for controlling bank 0 through bank 3.

The column address counter/latch circuit 19 is responsive to the control logic 11 and the address register 15. A series of column decoders 23 are responsive to the bank control logic 18 and the column address counter/latch 19. One column decoder 23 is provided for each memory array 22. As discussed above, DDR-III DRAM 10 includes four memory arrays 22 labeled bank 0 through bank 3. Accordingly, there are four column decoder circuits 23, one each for controlling bank 0 through bank 3. As will be discussed in more detail below, the column decoders 23 have dual control and drivers. An I/O gating circuit 24 is responsive to the column decoder circuits 23 for controlling sense amplifiers 25 within each of the memory arrays 22.

The DDR-III DRAM 10 may be accessed through a plurality of data pads 39 for either a write operation or a read operation. For a write operation, data on data pads 39 is received by receivers 26 and passed to input registers 27. Write buffer/driver circuits 28 buffer the received data which is then input to the memory arrays 22 through the I/O gating circuit 24.

Data that is to be read from the memory arrays 22 is output through the I/O gating circuit 24 to read sense-amplifier and driver circuit 38. In one embodiment, the read sense-amplifier and driver circuit 38 may include a read latch 29, multiplexer 30, driver 31, data strobe generator 32, and delay locked loop 33 circuits, among others. In the current embodiment, the data from the I/O gating circuit 24 is input into the read latch 29. From the read latch 29, the information is input to a multiplexer circuit 30, which outputs the data onto the data pads 39 through drivers 31. The drivers 31 are responsive to a data strobe generator 32 and to a delay locked loop circuit 33. The data strobe generator 32 is operable to produce data strobes for upper and lower bytes (i.e., UDQS, UDQS#, LDQS, and LDQS#) as is known in the art. The data strobes are also provided to data strobe output pads 34.

The DDR-III DRAM 10 also includes input data mask pads 35 for receiving upper data mask signals (UDM) and lower data mask signals (LDM) for the upper bytes (DQ8-DQ15) and lower bytes (DQ0-DQ7), respectively. The data pads 39, data strobe output pads 34, and data mask pads 35 may be part of a data bus 37.

The DDR-III DRAM 10 includes an on-die termination (ODT) circuit 36 which is operable to apply an effective resistance Rtt to the data pads 39, data strobe output pads 34, and input data mask pads 35 (or to another portion of the data bus). The memory controller 8 may issue an ODT control signal for enabling/disabling the ODT circuit 36. Those of ordinary skill in the art with recognize that the diagram of FIG. 2 has been simplified so as to focus on those elements which are helpful to understand the present invention while eliminating other elements not needed to understand the present invention.

Figure 3:
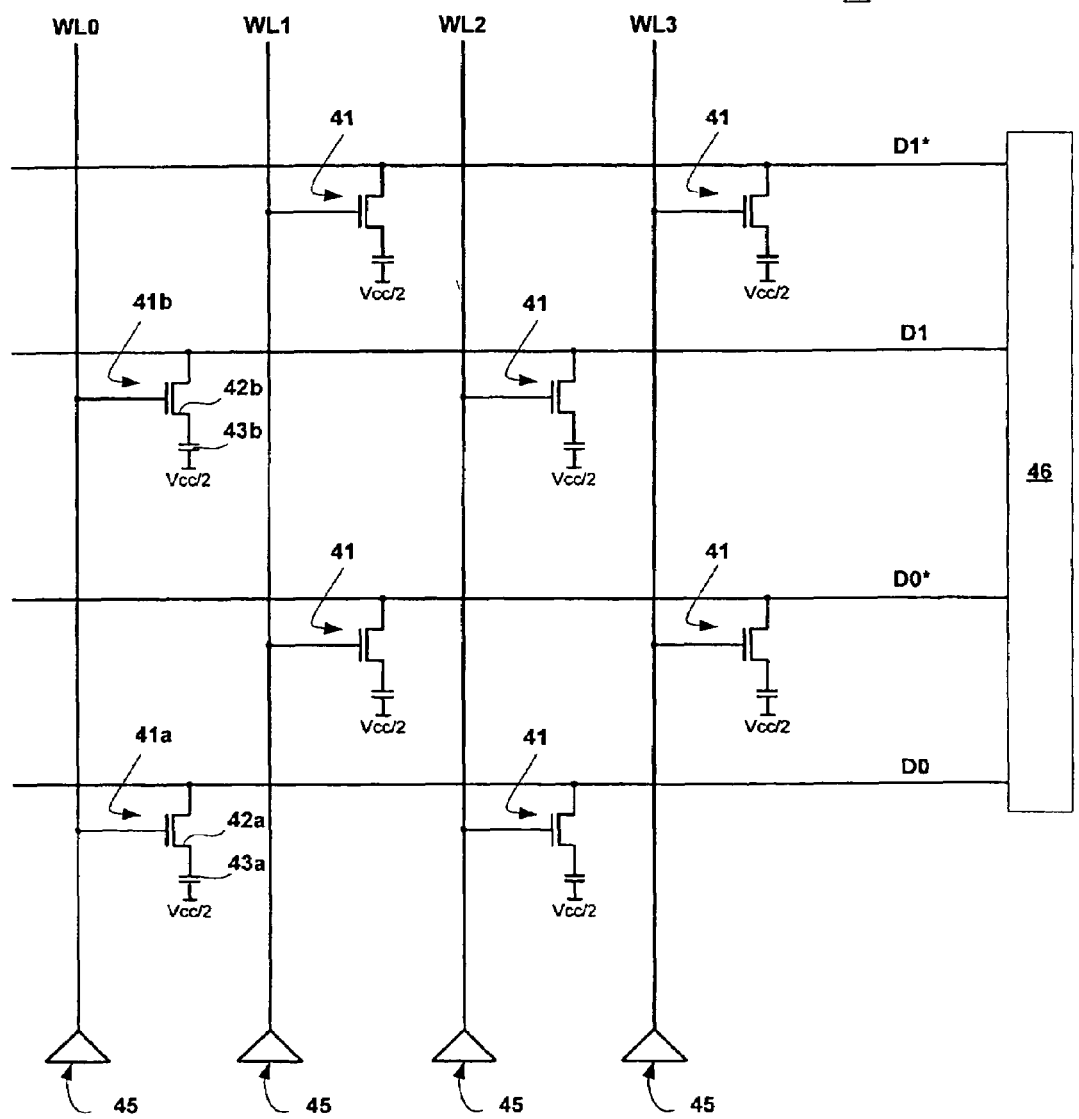
FIG. 3 is a simplified schematic of one bank of the memory array of FIG. 2.

FIG. 3 is a simplified schematic of one bank of the memory array 22 of FIG. 2. It should be apparent to those skilled in the art that the memory architecture illustrated in FIG. 2 is for exemplary purposes and that other DRAM architectures may be used while remaining within the scope of the present invention.

The array 22 is comprised of a plurality of memory cells or memory bits (mbit) 41, each of which includes a mbit transistor 42 and a storage capacitor 43. The mbits 41 are capable of holding binary information in the form of stored charge on their capacitors 43. The mbit transistors 42 operate as a switch interposed between the mbit capacitors 43 and their associated digitlines (e.g., D0, D0*, D1, D1*). The mbit transistors 42 are accessed and/or operated (i.e., activated/deactivated)

using signals supplied on an associated wordline (e.g., WL0, WL1, WL2, WL3) via wordline drivers 45.

Accessing an mbit 41 results in charge sharing between the accessed mbit capacitor 43 and its corresponding digitline (e.g., D0, D0*, D1, D1*). For example during a read operation, the digitlines (D0, D0*, D1, D1*) are set at a predetermined voltage (e.g., Vcc/2). If the accessed mbit capacitor 43 contains a stored logic one (e.g., Vcc), the charge between the capacitor and the digitline causes the voltage on the corresponding digitline (e.g., D0, D0*, D1, D1*) to increase. If the accessed mbit capacitor 43 contains a stored logic zero (e.g., 0V), the charge sharing causes the voltage on the corresponding digitline (e.g., D0, D0*, D1, D1*) to decrease. For instance, if WL0 is activated, mbit 41a shares its stored charge with digitline D0 and mbit 41b shares its stored charge with digitline D1.

It should be apparent to one skilled in the art that the size of the array 22 illustrated in FIG. 3 (i.e., with eight mbits 41, four wordlines WL0, WL1, WL2, WL3, and four digitlines (D0, D0*, D1, D1*) is used for exemplary purposes and that arrays having a different size and layout are within the scope of the present invention.

As will be discussed in more detail below, the digitlines (D0, D0*, D1, D1*) may be grouped into digitline pairs (D0-D0*, D1-D1*) and connected to peripheral devices 46. The peripheral devices 46 may be used during a read operation, for example, to determine whether the charge stored in the accessed mbit 41 was a logic one or a logic zero. Additionally, the peripheral devices 46 may be used during a write operation, for example, to store a charge representing a logic one or a logic zero in the accessed mbit 41.

Figure 4:
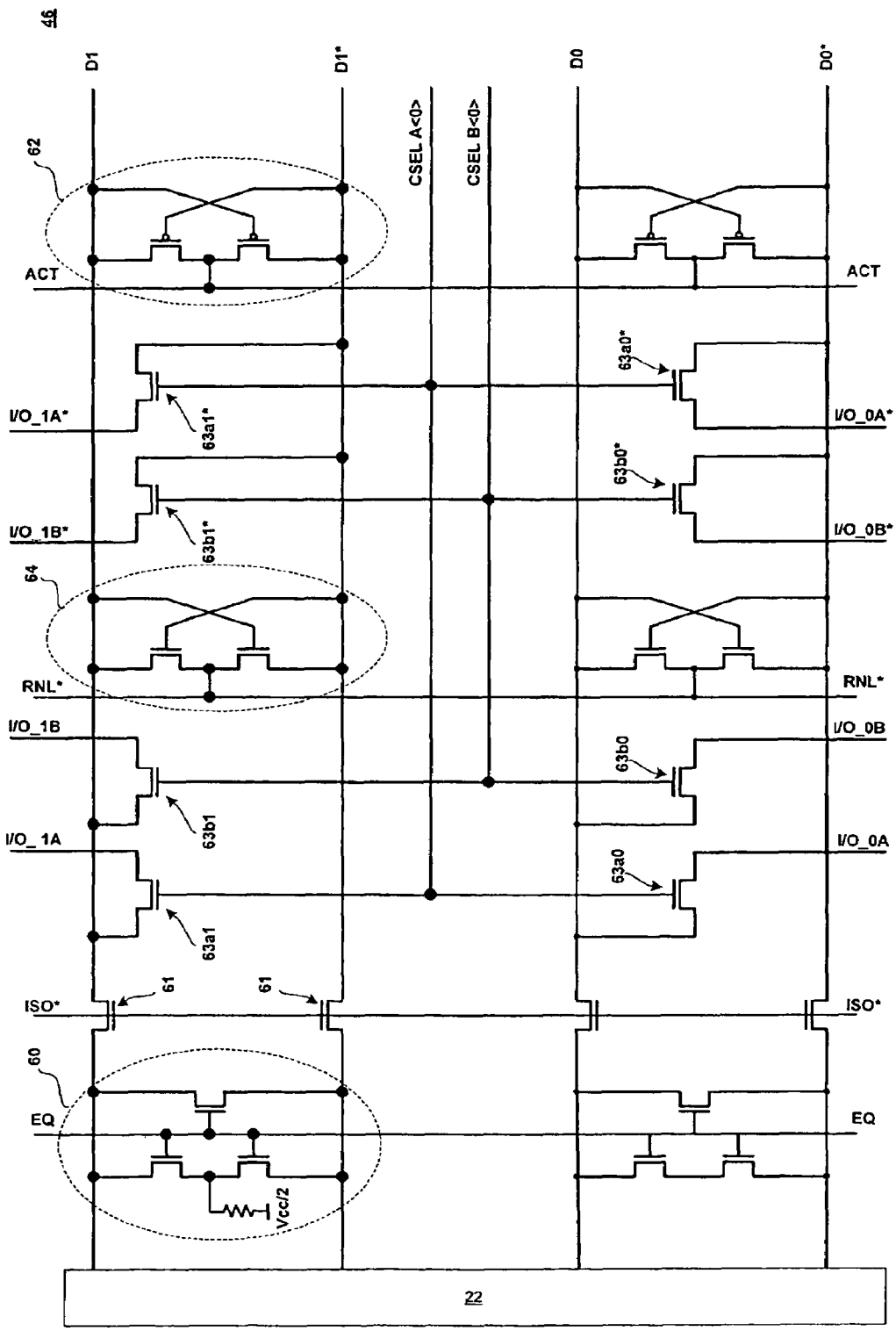
FIG. 4 is a simplified schematic illustrating some of the peripheral devices 46 that may be used in conjunction with the array of FIG. 3.

FIG. 4 is a simplified schematic illustrating some of the peripheral devices 46 that may be used in conjunction with the array 22 of FIG. 3. The peripheral devices 46 illustrated in FIG. 4 are laid out in a symmetrical fashion. For example, the peripheral devices spanning the digitline pair D1-D1* are similar to the peripheral devices spanning the digitline pair D0-D0*. It should be apparent to one skilled in the art that the peripheral devices shown in conjunction with digitlines D0 and D0* function in the same or similar manner as those discussed in conjunction with digitlines D1 and D1*. For clarity, however, the following discussion is restricted to the peripheral devices associated with digitline pair D1-D1* and only memory array 22 is illustrated. These restrictions are in no way intended to limit the scope of the present invention. It should be further be apparent to one skilled in the art that other peripheral devices may be used while remaining within the scope of the present invention.

Referring to digitline pair D1-D1* in FIG. 4, the peripheral devices 46 include an equalization circuit 60, a p-sense amplifier 62, and an n-sense amplifier 64; each of which spans the digitline pair D1-D1*. Digitline pair D1-D1* also includes isolations devices (e.g., transistors 61), input/output (I/O) devices (e.g., transistors 63a1, 63b1) connected to digitline D1, and I/O devices (e.g., transistors 63a1*, 63b1*) connected to digitline D1*.

It should be apparent to one skilled in the art that the peripheral devices discussed in conjunction with FIG. 4 correspond to some of the circuits illustrated and discussed in FIG. 2. For example, sense amplifiers 25 illustrated in FIG. 2 may include both the p-sense amplifier 62 and an n-sense amplifier 64 illustrated in FIG. 4, among others. As a further example, the I/O gating circuit 24 may include I/O transistors 63a1, 63b1, 63a1*, and 63b1*, among others.

As evident in FIG. 4, the equalization circuit 60 is responsive to an equalization signal (EQ) and is operable to drive the digitlines D1 and D1* to a common voltage potential (e.g., Vcc/2). The isolation transistors 61 are responsive to an isolation signal (ISO*) and are operable to isolate the array 22 (not shown in FIG. 4) from one or more of the peripheral devices and from other arrays that may be connected to the digitlines D1 and D1*. The p-sense amplifier 62 (responsive to activation signal ACT) and the n-sense amplifier 64 (responsive to n-latch signal RNL*) are operable to sense the charge store within, and refresh the charge stored within, a selected mbit 41 (e.g., mbit 41b which is selected by activating WL0 as discussed in conjunction with FIG. 3). The I/O transistors 63a1 and 63a1* are responsive to a column select signal CSEL_A and are operable to connect the digitlines D1 and D1* to the input/output lines I/O_1A and I/O_1A*, respectively. The I/O transistors 63b1 and 63b1* are responsive to a column select signal CSEL_B and are operable to connect the digitlines D1 and D1* to the input/output lines I/O_1B and I/O_1B*, respectively.

For a read operation, the digitlines D1 and D1* are initially equalized at a predetermined voltage (here Vcc/2) by setting ISO and EQ high. One or more of these signals then transition low when an array is accessed. For example if array 22 is accessed, then EQ transitions low.

Next, a selected wordline is fired such that a memory cell identified by address information from memory controller 8 is accessed. The memory cell shares its charge with its associated digitline. For example, assume that wordline WL0 (as shown in FIG. 3) is selected such that the memory cell located at the intersection of WL0 and digitline D1 (i.e., mbit 41b) is accessed. When WL0 is fired, the charge stored in mbit 41b is shared with digitline D1. If the mbit 41b contains a stored logic one (i.e., Vcc), the charge sharing causes the voltage (i.e., Vcc/2) on digitline D1 to increase. If mbit 41b contains a stored logic zero (e.g., 0V), the charge sharing causes the voltage (i.e., Vcc/2) on digitline D1 to decrease. Returning to FIG. 4, it should be noted that digitline D1* remains substantially at the precharge level Vcc/2 (the voltage of digitline D1* may change slightly due to parasitic coupling with, for example, D1 and the wordline).

The differential voltage between digitlines D1 and D1* is read or sensed by the sense amplifiers (e.g., n-sense amplifier 64 and p-sense amplifier 62). Sensing generally refers to the amplification of the differential voltage (i.e., the digitline signal) between two digitlines (e.g., D1 and D1*). Because the differential voltage developed between digitlines D1 and D1* is used to read the memory cell contents, digitlines D1 and D1* are often referred to as a digitline pair. In the current embodiment, the sensed signal and its complement are output via input/output lines I/O_1A and I/O_1A* by activating the I/O transistors 63a1, and 63a1* using the column select signal (CSEL_A) or via input/output lines I/O_1B and I/O_1B* by activating the I/O transistors 63b1, and 63b1* using the column select signal (CSEL_B).

The input/output lines (I/O_1A, I/O_1A*, I/O_1B, I/O_1B*) may be connected to additional circuitry, such as write drivers 28 (not shown in FIG. 4), read sense-amplifiers and drivers 38 (not shown in FIG. 4) etc., as is known in the art. In one embodiment, each digitline (e.g., D0, D0*, D1, D1*) is associated with dual column select lines (e.g., CSEL_A and CSEL_B), dual I/O lines (e.g., I/O_1A, I/O_1A*, I/O_1B, I/O_1B*), dual write drivers write drivers 28 (not shown in FIG. 4), and dual read sense-amplifiers and drivers 38 (not shown in FIG. 4), among others, such that a pipeline scheme for column read/write may be implemented.

Figure 5:
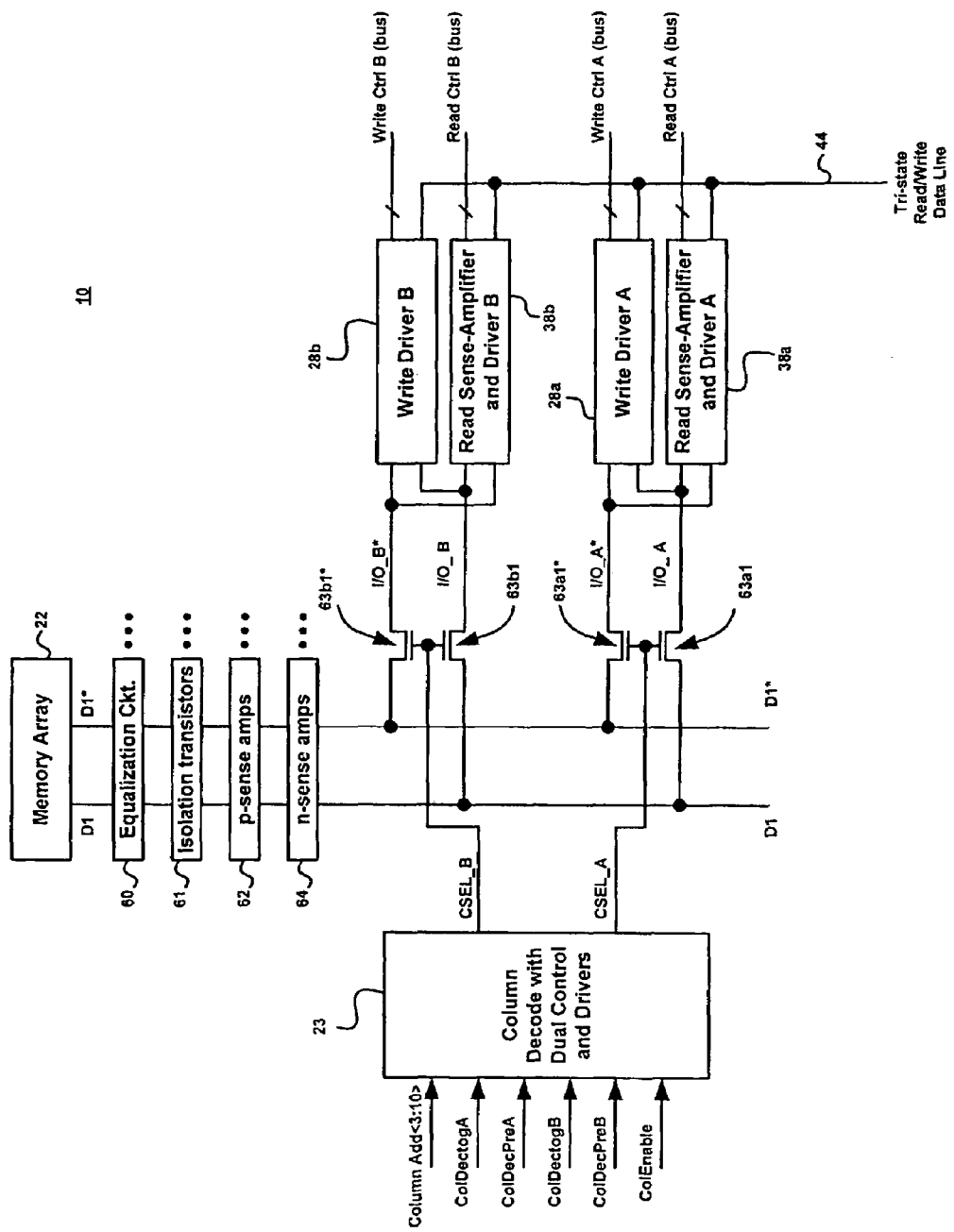
FIG. 5 illustrates a simplified block diagram of a portion of the DDR-III DRAM illustrated in FIG. 2 according to one embodiment.

FIG. 5 illustrates a simplified block diagram of a portion of the DDR-III DRAM 10 illustrated in FIG. 2 according to one embodiment. A memory cell within array 22 may be accessed (as discussed above in conjunction with FIGS. 3 and 4) using p-sense amplifier 62, n-sense amplifier 64, isolation transistors 61, equalization circuit 60, etc. As illustrated in FIG. 5 (and unlike the prior art), each digitline D1 and D1* is associated with dual input/output devices, dual input/output lines, dual write drivers, and dual read sense-amplifiers and drivers. For example, digitline D1 is associated with I/O transistors 63a1 and 63b1, input/output lines I/O_A and I/O_B, write drivers 28a and 28b, and read sense-amplifiers and drivers 38a and 38b. Likewise digitline D1* is associated with I/O transistors 63a1* and 63b1*, input/output lines I/O_A* and I/O_B*, dual write drivers 28a and 28b, and read sense-amplifiers and drivers 38a and 38b. As seen in FIG. 5, I/O transistors 63a1 and 63ab1 are responsive to CSEL_A; whereas is I/O transistors 63ba1 and 63b1* are responsive to CSEL_B.

By using dual input/output lines, dual write drivers, and dual read sense-amplifiers and drivers for each digitline, faster access times and/or faster read/write cycle times (i.e., the time it takes to read and/or write to a memory cell) or die size savings can be achieved as compared to prior art memory devices. Faster access times are desirable because processor speed and system clock frequency continue to increase.

Column decoder 23 is responsive to the column address signal (ColumnAdd<3:10>), the column decode toggle signals (ColDectogA, ColDectogB), the column decode precharge signals (ColDecPreA, ColDecPreB), and the column enable signal (ColEnable). Column decoder 23 produces column select signals CSEL_A and CSEL_B. As discussed above, CSEL_A is used to activate the I/O transistors 63a1, and 63a1*, thus connecting digitlines D1 and D1* to input/output lines I/O_1A and I/O_1A*. Input/output lines I/O_1A and I/O_1A* are connected to write driver 28a and read sense-amplifier and driver 38a. Write driver 28a is responsive to a write control signal (Write Ctrl A), whereas read sense-amplifier and driver 38a is responsive to a read control signal (Read Ctrl A).

Similarly, CSEL_B is used to activate the I/O transistors 63b1, and 63b1*, thus connecting digitlines D1 and D1* to input/output lines I/O_1B and I/O_1B*. Input/output lines I/O_1B and I/O_1B* are connected to write driver 28b and read sense-amplifier and driver 38b. Write driver 28b is responsive to a write control signals (Write Ctrl B bus), whereas read sense-amplifier and driver 38b is responsive to a read control signals (Read Ctrl B bus).

Figure 6:
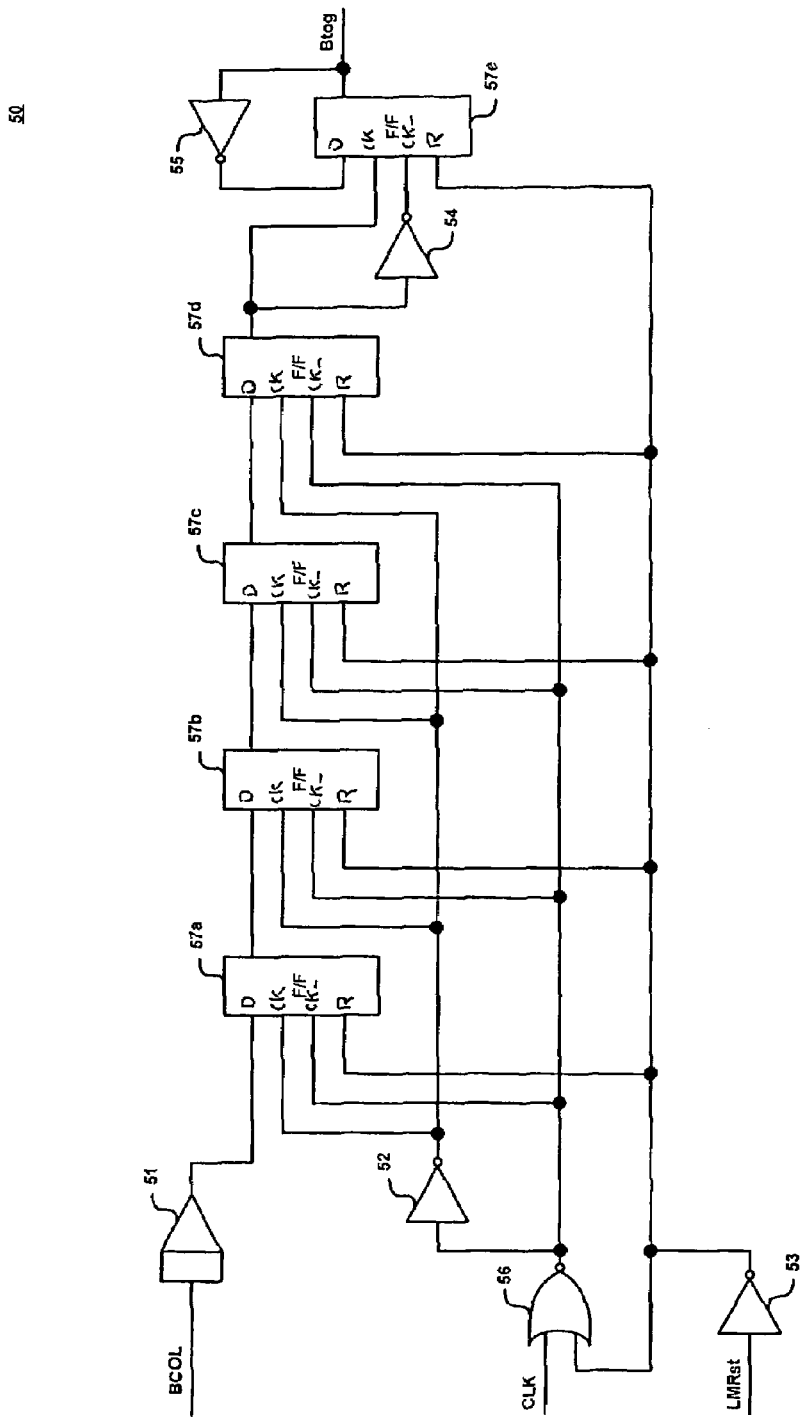
FIG. 6 is a simplified schematic of a circuit for generating a master toggle signal for the DDR-III DRAM illustrated in FIG. 5 according to one embodiment.

FIG. 6 is a simplified schematic of a circuit 50 for generating a master toggle signal (Btog) for the DDR-III DRAM illustrated in FIG. 5 according to one embodiment. Circuit 50 includes a buffer 51, inverters 52, 53, 54, 55 a NOR gate 56, and several flip-flops 57. In the current embodiment, Btog is generated on the fifth clock pulse in response to a read or write command (e.g., BCOL). (A DDR-III DRAM, an internal read or write cycle requires four clock pulses to complete an operation.) The Btog signal, in turn, enables CDectogA or CDectogB as well as other read/write control signals A or B.

Referring to FIG. 6, the BCOL signal is applied to the input of buffer 51. The output of buffer 51 is applied to one input of flip-flop 57a. A clock signal (CLK) is applied to one input of NOR gate 56, whereas a reset signal (i.e., LMRst) is inverted by inverter 53 and supplied to the other input of NOR gate 56. The output of NOR gate 56 is applied to the input of inverter 52 and supplied to an input of each of flip-flops 57a, 57b, 57c, and 57d. The output of inverters 52 and 53 are also supplied to inputs of each of flip-flops 57a, 57b, 57c, and 57d. As seen in FIG. 6, the output of flip-flop 57a is supplied to an input of flip-flop 57b, the output of flip-flop 57b is supplied to an input of 57c, and the output of flip-flop 57c is supplied to the input of flip-flop 57d. Furthermore, the output of flip-flop 57d is supplied to the input of inverter 54 and to an input of flip-flop 57e. The output of inverter 54 is also supplied to an input of flip-flop 57e. The output of flip-flop 57e is the Btog signal, which is also fed back through inverter 55 to another input of flip-flop 57e.

In the current embodiment, the column decode toggle signals (ColDectogA and ColDectogB) are generated in response to Btog. For example, the ColDectogA goes high on the falling edge of the master toggle signal; whereas ColDectogB goes high on the rising edge of the master toggle signal (Btog). Thus, the column decode toggle signals (ColDectogA and ColDectogB) are alternatingly fired. Accordingly, ColDectogA goes high, when ColDectogB goes low and ColDectogB goes high when ColDectogA goes low. As a result, column select signals CSEL_A and CSEL_B are also alternatingly fired (i.e., CSEL_A goes high when CSEL_B goes low, and CSEL_B goes high when CSEL_A goes low). Accordingly, CSEL_A and CSEL_B may be referred to as being semi-independent of each other. It should be noted that in the current embodiment, CSEL_A (or CSEL_B) are activated only when the device receives a read or write command (and only one column select signal at a time is activated).

Additionally, in the current embodiment, the column decode precharge signals (ColDecPreA and ColDecPreB) are used to set the column select lines (CSEL_A and CSEL_B, respectively) to a predetermined voltage level prior to the firing of the column decode toggle signals (ColDectogA and ColDectogB). Thus, the ColDecPreA goes high on the rising edge of the master toggle signal; whereas ColDecPreB goes high on the falling edge of the master toggle signal.

Figure 7:
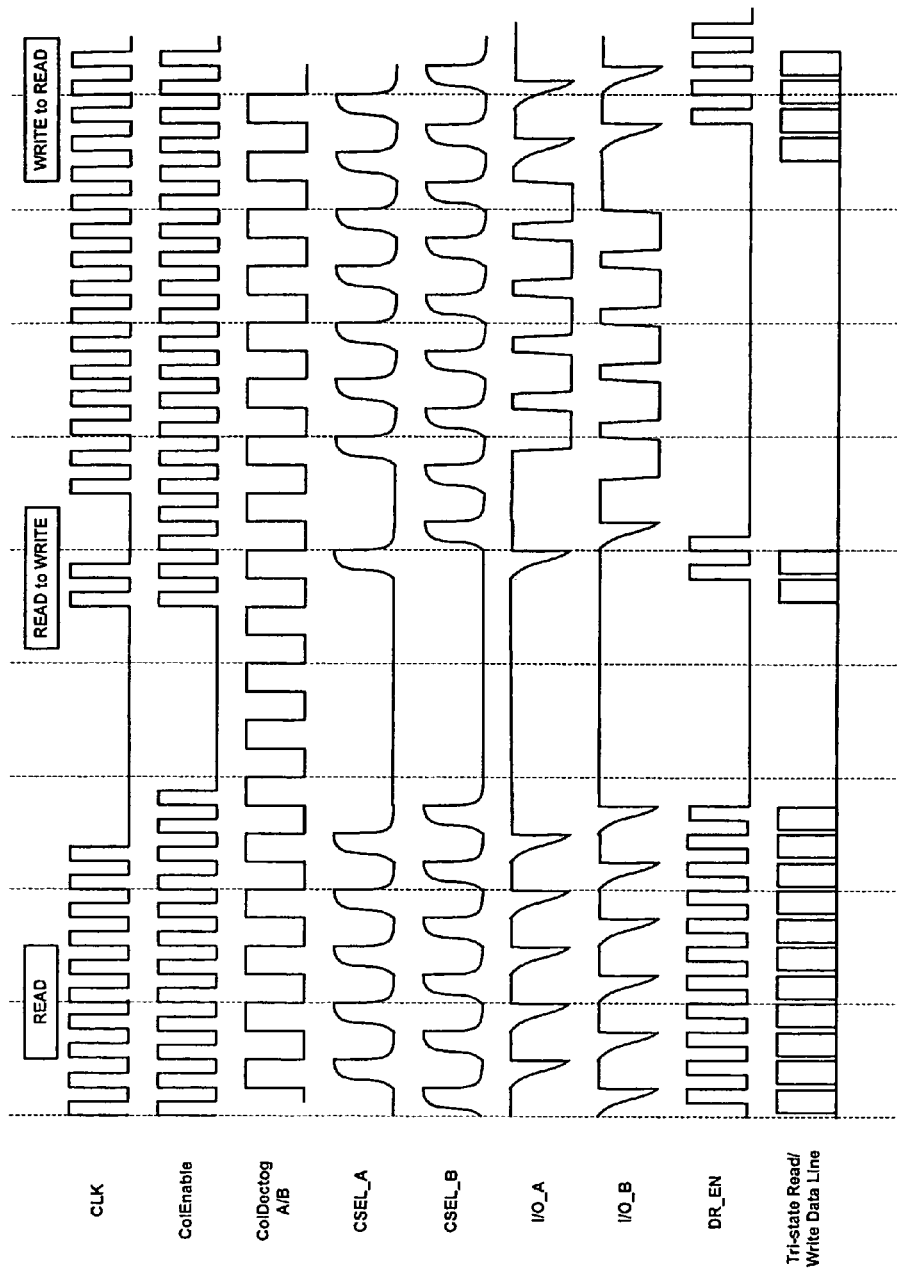
FIG. 7 is a timing diagram illustrating several signal waveforms for the memory system of FIG. 1 according to one embodiment.

FIG. 7 is a timing diagram illustrating several signal waveforms for the memory system 2 of FIG. 1 according to one embodiment. As seen in FIG. 7, column select signals CSEL_A and CSEL_B are responsive to the column decode toggle signals (ColDectogA and ColDectogB) and the column enable signal (ColEnable), among others. Furthermore, the output carried by the tri-state read/write data line 44 (as shown in FIG. 5) is responsive to CSEL_A, CSEL_B, ColDectogA, ColDectogB, and a driver enable signal (DR_EN), among others. The tri-state read/write data line 44 may be connected to data pads 39 (shown in FIG. 2). The memory system's 2 use of dual I/O devices, dual column select lines, dual input/output lines, dual write drivers, and dual read sense-amplifiers and drivers permits increased input/output data rates as compared to prior art memory systems.

Figure 8:
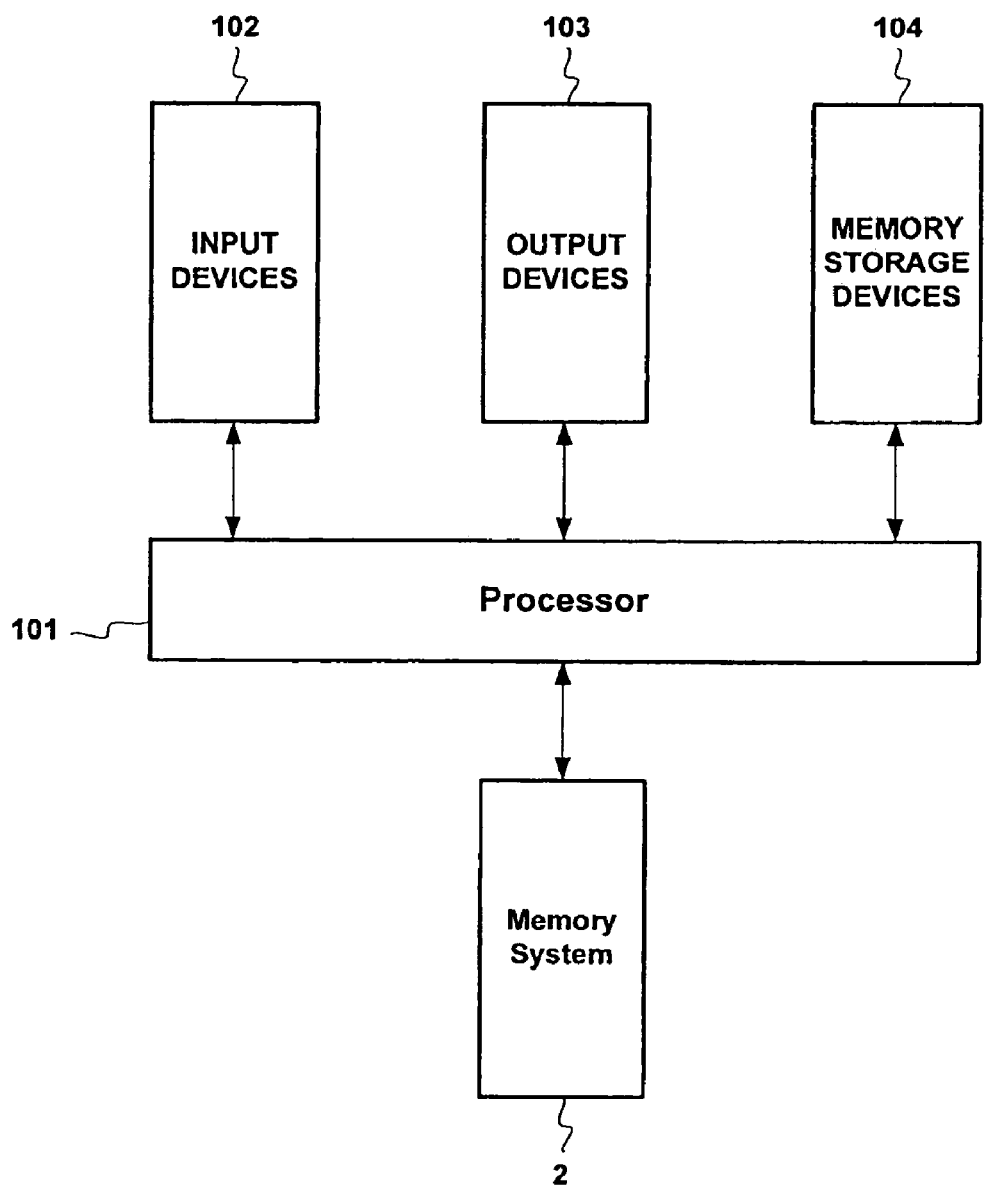
FIG. 8 is a block diagram depicting a computing system 100 incorporating the memory system illustrated in FIG. 1 according to one embodiment.
Figure 9:
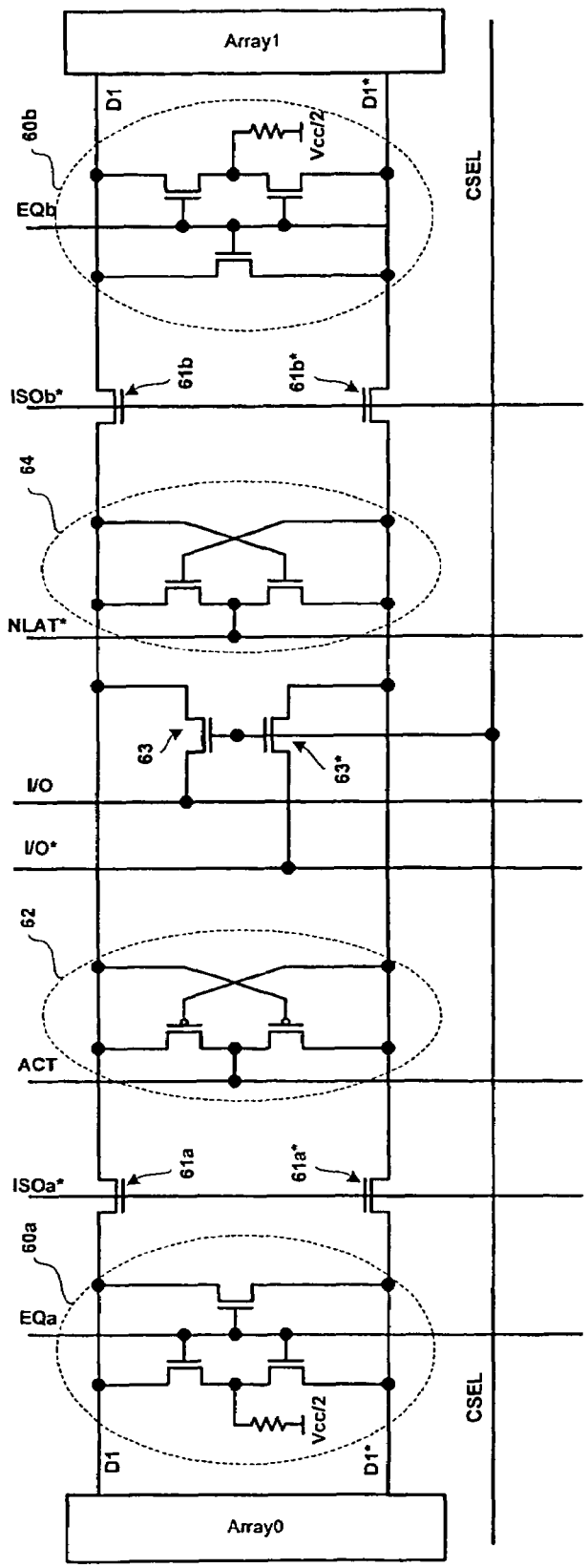
FIG. 9 illustrates peripheral devices used by a DRAM according to the prior art.
Figure 10:
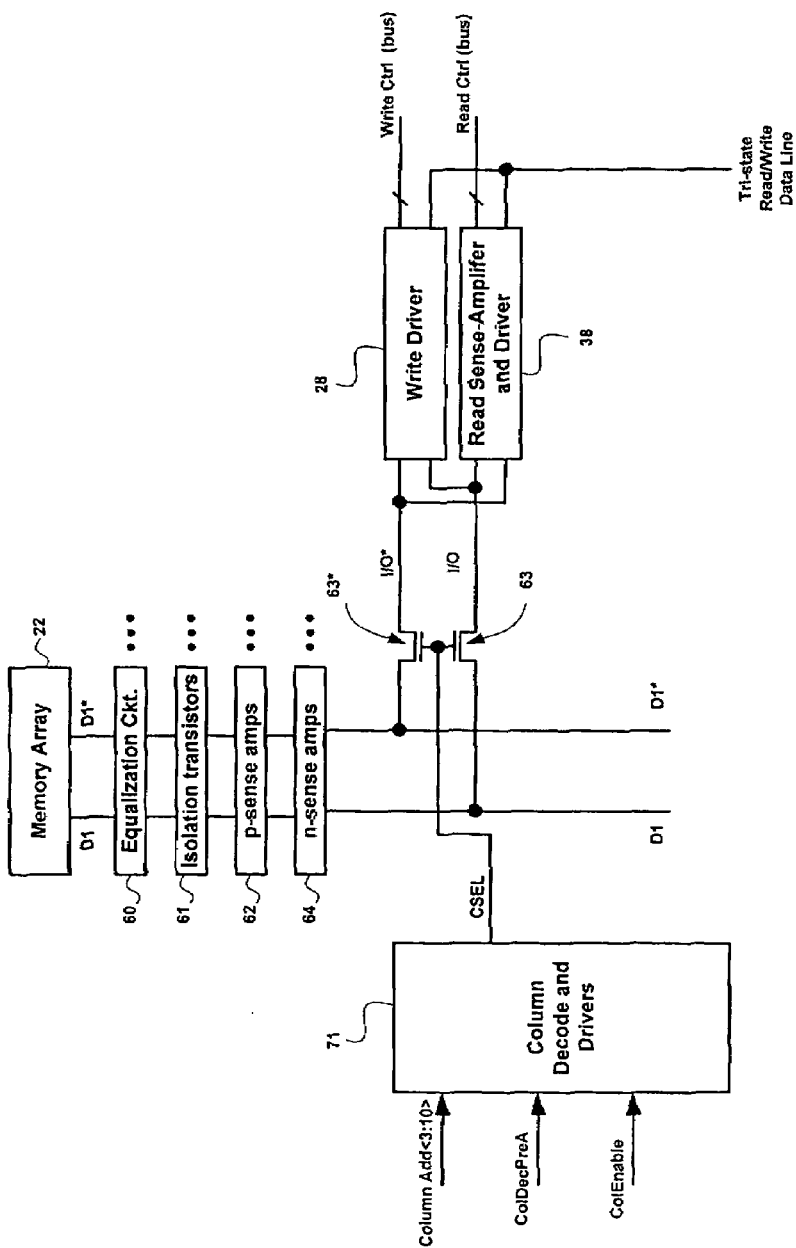
FIG. 10 illustrates a simplified block diagram of a portion of a prior art memory system.

FIG. 8 is a block diagram depicting a computing system 100 that incorporates memory system 2 illustrated in FIG. 1. The computing system 100 may include a processor 101, one or more input devices 102 (e.g., keyboard, mouse, microphone, bar code reader, RFID reader, etc.), one or more output devices 103 (e.g., printers, video terminals, video display units, etc.), one or more data storage devices 104 (i.e., CD-ROM, disk drive, tape drive, ZIP drive, etc.), and the memory system 2. Computing system 100 may also include mixed input/output devices (not shown) such as modems, network interface cards, and touch screens (among others) while remaining within the scope of the present invention.

The processor 101 may be a microprocessor, micro-controller, and ASIC, among others. The processor 101 is capable of performing various computing functions, such as executing software functions to perform specific calculations and/or data processing tasks. Input devices 102 are connected to the processor 101 to allow a user to manually input data, instructions, etc., to operate the computing system 100. Output devices 103 are connected to the processor 101 and display or otherwise output generated data. Data storage devices 104 are also connected to the processor 101 and are operable to store various software and data sets for use by processor 101. The processor 101 is capable of performing a plurality of functions based on information and data stored in the memory system 2 and the storage devices 104 (among others) and/or information or data entered via input devices 102 (among others).

It should be recognized that the above-described embodiments of the invention are intended to be illustrative only. Numerous alternative embodiments may be devised by those skilled in the art without departing from the scope of the following claims. For example, the scope of the present invention may extend to other types of circuits and should not be limited solely to column address decoders.

What is claimed is:

1. A memory device, comprising:
    a memory array having a plurality of memory cells; a plurality of digitlines each connected to certain of said plurality of memory cells; and a plurality of peripheral devices for reading data out of and writing data into said memory array through said digitlines, said peripheral devices comprising:
        a plurality of first write drivers and a plurality of second write drivers, one of said plurality of first write drivers and one of said plurality of second write drivers each connected to a same one of said plurality of digitlines through one of a plurality of first input/output lines and one of a plurality of second input/output lines, respectively; and
        a plurality of first input/output devices and a plurality of second input/output devices responsive to one of a plurality of first column select signals and a plurality of second column select signals for controlling the connection of said plurality of first write drivers and said plurality of second write drivers, respectively, to said plurality of digitlines.

2. The memory device of claim 1 wherein said plurality of peripheral devices for reading data out of said memory array further includes a plurality of p-sense amplifiers and n-sense amplifiers responsive to said digitlines.

3. The memory device of claim 1 wherein said plurality of peripheral devices includes a decoder operable to generate said first and second column select signals in response to a first column decode toggle signal, a second column decode toggle signal, a column address signal, and a column enable signal.

4. The memory device of claim 2 wherein said first plurality and said second plurality of input/output devices are transistors.

5. The memory device of claim 2 wherein each of said first plurality and each of said second plurality of write drivers is connected to at least one tri-state read/write data line.

6. A memory device, comprising:
    a memory array having a plurality of memory cells; a plurality of digitlines each connected to certain of said plurality of memory cells; and a plurality of peripheral devices for reading data out of and writing data into said memory array through said digitlines, said peripheral devices comprising:
        a plurality of first read amplifiers and a plurality of second read amplifiers, one of said plurality of first read amplifiers and one of said plurality of second read amplifiers each connected to a same one of said plurality of digitlines through one of a plurality of first input/output lines and one of a plurality of second input/output lines, respectively; and
        a plurality of first input/output devices and a plurality of second input/output devices responsive to one of a plurality of first column select signals and a plurality of second column select signals for controlling the connection of said plurality of first read amplifiers and said plurality of second read amplifiers, respectively, to said plurality of digitlines.

7. The memory device of claim 6 wherein each of said first and each of said second plurality of read amplifiers comprises a p-sense amplifier and an n-sense amplifier.

8. The memory device of claim 6 wherein said plurality of peripheral devices includes a decoder operable to generate said first and second column select signals in response to a first column decode toggle signal, a second column decode toggle signal, a column address signal, and a column enable signal.

9. The memory device of claim 6 wherein said first plurality and said second plurality of input/output devices are transistors.

10. The memory device of claim 6 wherein each of said first plurality and each of said second plurality of read amplifiers is connected to at least one tri-state read/write data line.

11. A memory system, comprising:
    a memory controller; a memory device; and a bus interconnecting said memory controller and said memory device, said memory device comprising:
        a memory array having a plurality of memory cells; a plurality of digitlines each connected to certain of said plurality of memory cells; and a plurality of peripheral devices for reading data out of and writing data into said memory array through said digitlines, said peripheral devices comprising:
            a plurality of first write drivers and a plurality of second write drivers, one of said plurality of first write drivers and one of said plurality of second write drivers each connected to a same one of said plurality of digitlines through one of a plurality of first input/output lines and one of a plurality of second input/output lines, respectively; and
            a plurality of first input/output devices and a plurality of second input/output devices responsive to one of a plurality of first column select signals and a plurality of second column select signals for controlling the connection of said plurality of first write drivers and said plurality of second write drivers, respectively, to said plurality of digitlines.

12. The system of claim 11 wherein said plurality of peripheral devices for reading data out of said memory array further includes a plurality of p-sense amplifiers and n-sense amplifiers responsive to said digitlines.

13. The system of claim 11 wherein said plurality of peripheral devices includes a decoder operable to generate said first and second column select signals in response to a plurality of control signals and an address signal.

14. The system of claim 11 wherein each of said first plurality and each of said second plurality of write drivers is connected to at least one tri-state read/write data line.

15. A memory system, comprising:
    a memory controller; a memory device; and a bus interconnecting said memory controller and said memory device, said memory device comprising:
        a memory array having a plurality of memory cells; a plurality of digitlines each connected to certain of said plurality of memory cells; and a plurality of peripheral devices for reading data out of and writing data into said memory array through said digitlines, said peripheral devices comprising:
            a plurality of first read amplifiers and a plurality of second read amplifiers, one of said plurality of first read amplifiers and one of said plurality of second read amplifiers each connected to a same one of said plurality of digitlines through one of a plurality of first input/output lines and one of a plurality of second input/output lines, respectively; and a plurality of first input/output devices and a plurality of second input/output devices responsive to one of a plurality of first column select signals and a plurality of second column select signals for controlling the connection of said plurality of first read amplifiers and said plurality of second read amplifiers, respectively, to said plurality of digitlines.

16. The system of claim 15 wherein each of said first and each of said second plurality of read amplifiers comprises a p-sense amplifier and an n-sense amplifier.

17. The system of claim 15 wherein said plurality of peripheral devices includes a decoder operable to generate said first and second column select signals in response to a plurality of control signals and an address signal.

18. The system of claim 15 wherein each of said first plurality and each of said second plurality of read amplifiers is connected to at least one tri-state read/write data line.

* * * * *